(12) United States Patent
Chang et al.

(10) Patent No.: US 7,057,406 B2
(45) Date of Patent: Jun. 6, 2006

(54) INTEGRATED TYPE PROBE CARD AND ITS FABRICATION METHOD

(75) Inventors: Jyh-Chun Chang, Taipei (TW); Horng-Jee Wang, Taipei (TW); Min-Chieh Chou, Taipei (TW); Kun-Chih Pan, Taichung (TW); Ya-Ju Huang, Taipei (TW); Chu-Shu Tsai, Taipei (TW); Chih-Wei Chen, Yilan (TW)

(73) Assignee: Industrial Technology Research Institute, Hsinchu Hsien (TW)

( * ) Notice: Subject to any disclaimer, the term of this patent is extended or adjusted under 35 U.S.C. 154(b) by 17 days.

(21) Appl. No.: 10/822,666

(22) Filed: Apr. 13, 2004

(65) Prior Publication Data
US 2005/0174132 A1 Aug. 11, 2005

(51) Int. Cl.
*G01R 31/26* (2006.01)

(52) U.S. Cl. ........................ 324/754; 324/761

(58) Field of Classification Search ........ 324/754–765; 439/482, 824; 29/843, 874
See application file for complete search history.

(56) References Cited

U.S. PATENT DOCUMENTS

| | | | |
|---|---|---|---|
| 4,027,935 A | 6/1977 | Byrnes et al. | |
| 4,754,256 A | 6/1988 | Fluhr et al. | |
| 5,090,118 A | 2/1992 | Kwon et al. | |
| 5,475,318 A | 12/1995 | Marcus et al. | |
| 5,806,181 A * | 9/1998 | Khandros et al. | 29/874 |
| 5,917,707 A * | 6/1999 | Khandros et al. | 361/776 |
| 6,072,190 A | 6/2000 | Watanabe et al. | |
| 6,615,485 B1 * | 9/2003 | Eldridge et al. | 29/843 |
| 2002/0080588 A1 | 6/2002 | Eldridge et al. | |

\* cited by examiner

*Primary Examiner*—Vinh P. Nguyen
(74) *Attorney, Agent, or Firm*—Bacon & Thomas, PLC

(57) ABSTRACT

An integrated type probe card includes a circuit space converter having first and second contacts arranged at different density at two sides, probes connected to the contacts at one side of the circuit space converter that are arranged at a high density probes; a spring connector plate, which holds metal spring members in respective receiving holes thereof, a circuit board pressed on the metal spring members against the contacts at the other side of the circuit space converter that are arranged at a low density, and a level adjustment mechanism that accommodates the probes, the circuit space converter, the spring connector plate and the circuit board and enables the user to adjust the level status of the circuit space converter, keeping the circuit space converter electrically connected to the circuit board for transmitting test signal from the probes to the circuit board.

17 Claims, 5 Drawing Sheets

INTEGRATED TYPE PROBE CARD AND ITS FABRICATION METHOD

BACKGROUND OF THE INVENTION

1. Field of the Invention

The present invention relates to a probe card or electrical contactor assembly and more particularly, to an integrated type probe card. The invention relates also to the fabrication of the integrated type probe card.

2. Description of the Related Art

Various probe cards or electrical contactor assemblies are seen in U.S. Pat. Nos. 4027935; 4754256; 5090118; 5475318; 6072190. These probe cards or electrical contactor assemblies are different in structural design, principle of action and method of fabrication, however they commonly have numerous drawbacks. Regular probe cards include cantilever type, for example, epoxy ring probe cards, and vertical type, for example, cobra probe cards. These two types require much labor to install probes (tungsten contact pins, lead contact pins, or steel contact pins) in the circuit board individually and to adjust the heights of the probes. Because of much human labor is used during fabrication, much fabrication time is required and unequal level status of the probes may affect test stability. Because each probe has a big part exposed to the outside without insulation, parasitic capacitance and induction may produce, resulting in attenuation of high frequency test signal and increase of crosstalk. If the surface of the circuit board under test is not in level, low deformability of probes cannot keep all probes in effective contact with the test points.

Further, there is a limitation to probe installation density by labor. The minimum pitch is about 50 μm for cantilever type, or about 100 μm for vertical type. High pin counts results in high manufacturing cost. This pin count limitation imparts a barrier to the development of electronic elements.

Further, in U.S. Pat. No. 2002/0080588A1, the spring members used for transmitting test signal from the probes to the circuit board are coiled metal wires. The gap between each two adjacent spring members is insufficient to eliminate crosstalk, and signal error may be produced. Crosstalk may cause an inaccurate test result.

SUMMARY OF THE INVENTION

The present invention has been accomplished under the circumstances in view. It is one object of the present invention to provide an integrated type probe card, which has the probes integrated, reducing the manufacturing cost. It is another object of the present invention to provide an integrated type probe card, which enables the level status of the probes to be conveniently adjustable. It is still another object of the present invention to provide an integrated type probe card, which eliminates the production of noises during signal transmission.

To achieve these and other objects of the present invention, the integrated type probe card comprises a plurality of probes; a circuit space converter, the circuit space converter comprising multiple layers of circuits therein, and a plurality of first contacts and second contacts respectively arranged at two opposite sides of the multiple layers of circuits and electrically connected to the circuits, the density of the first contacts being higher than the second contacts, the first contacts being respectively connected to the probes for transmitting signal from the probes to the second contacts; a spring connector plate, the spring connector plate comprising a holder plate, the holder plate having a predetermined number of receiving holes extended through top and bottom sides thereof, and a plurality of metal spring members respectively mounted in the receiving holes of the holder plate, the metal spring members each having two distal ends respectively protruded over the top and bottom sides of the holder plate and having one of the respective two distal ends respectively electrically connected to the second contacts of the circuit space converter; a circuit board pressed on one of the two distal ends of each of the metal spring members against the second contacts of the circuit space converter, the circuit board having a plurality of circuits and contacts arranged on one side thereof and electrically connected to the metal spring members of the spring connector plate for testing electric signal transmitted from the probes; and a level adjustment mechanism adapted to hold the probes, the circuit space converter, the spring connector plate and the circuit board in order and to adjust the level status of the circuit space converter, for enabling the metal spring members to compensate elevational difference between the circuit space converter and the spring connector plate and to keep the circuit space converter electrically connected to the circuit board.

DETAILED DESCRIPTION OF THE INVENTION

Figure 1:
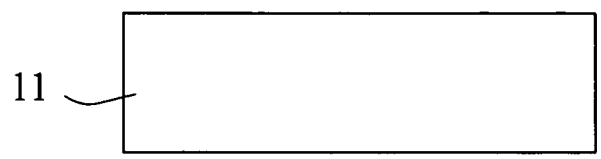
FIG. 1 is a schematic drawing showing the formation of probes for integrated type probe card according to the present invention (I).

Referring to FIGS. 1~11, an integrated type probe card 100 is shown comprised of a predetermined number of probes or contacts 10, a circuit space converter 20, a spring connector plate 30, a circuit board 40, and a level adjustment mechanism 50.

The probes 10 are made subject to the following Steps I~IV:

Step I: Material preparation. As shown in FIG. 1, a strip-like substrate, for example, a silicon wafer 11 is prepared and pre-treated with washing, drying, and other requisite pre-treatment processes (FIG. 1 is a side view in section of the silicon wafer).

Figure 2:
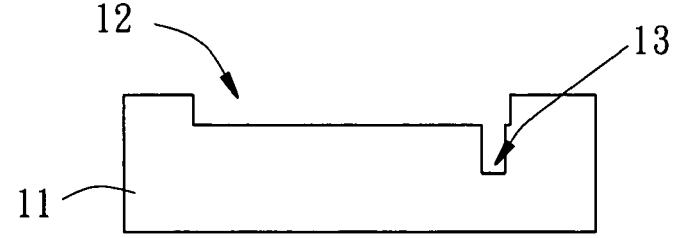
FIG. 2 is a schematic drawing showing the formation of probes for integrated type probe card according to the present invention (II).
Figure 3:
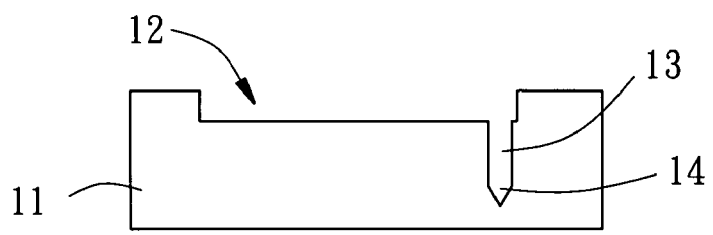
FIG. 3 is a schematic drawing showing the formation of probes for integrated type probe card according to the present invention (III).

Step II: Substrate etching. As shown in FIG. 2, LIGA (Lithography process) is employed to precisely define the geometrical shape and locations of probe tips, and then anisotropic etching is employed to etch the silicon wafer 11 to a predetermined depth by means of RIE (Reactive Ion Etching) so as to form elongated cantilever spaces 12 of high aspect ratio, and then anisotropic etching is repeated to etch one end of each elongated cantilever space 12 to a predetermined depth by means of RIE (etching depth over the bottom of each cantilever space 12) so as to form probe head spaces 13, and then the etched substrate is dipped in a silicon etching solution, for example, KOH (potassium hydroxide) to have an etched space 14 shaped like an inverted quadrilateral pyramid be formed in the bottom side of each probe head space 13, keeping the bottom side of each etched space 14 at the same depth. Alternatively, this etching step can be done by: forming the etched space by means of the application of the silicon etching solution, and then employing RIE to make the cantilever spaces and the probe head spaces. Because the aforesaid RIE and anisotropic etching are known techniques, no further detailed description in this regard is necessary.

Figure 4:
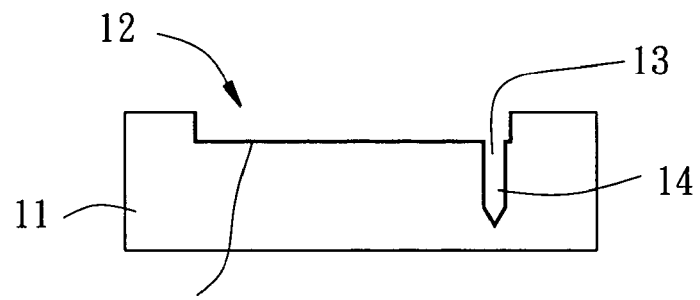
FIG. 4 is a schematic drawing showing the formation of probes for integrated type probe card according to the present invention (IV).

Step III: Seed layer formation. As shown in FIG. 4, sputtering technique is employed to form a seed layer 15 in the probe head spaces 13, etched spaces 14 and cantilever spaces 12. The material used in sputtering is an electrically conductive material, for example, copper, nickel, titanium, or any suitable metal. Instead of sputtering, the seed layer 15 can be made by means of evaporation, deposition, or any suitable processing process.

Figure 5:
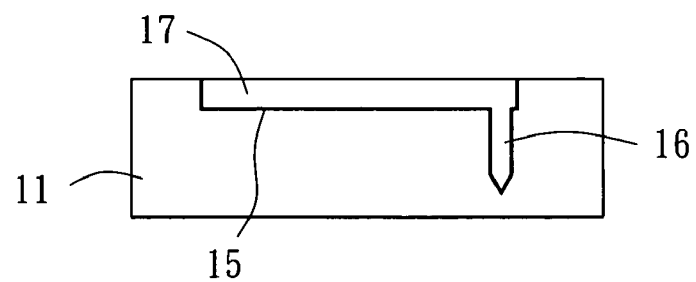
FIG. 5 is a schematic drawing showing the formation of probes for integrated type probe card according to the present invention (V).

Step IV: Electro-forming of probe heads and cantilevers. As shown in FIG. 5, micro electro-forming technique is employed to make probe heads 16 and cantilevers 17 in the probe head spaces 13 and etched spaces 14 and the cantilever spaces 12. The metal used in micro electro-forming is Ni—Co (nickel cobalt alloy) for the advantages of good conductivity and mechanical properties.

The circuit space converter 20 comprises a multilayer ceramic substrate (MLC) 21, which has multiple layers of circuits arranged therein, contacts 65 disposed at the top side, and contacts 66 disposed at the bottom side, the contacts 65,66 being at predetermined locations and respectively electrically connected to the circuits. Subject to the arrangement of the multiple layers of circuits, the density of the contacts 65 at the top side is higher than the density of contacts 66 at the bottom side.

Figure 6:
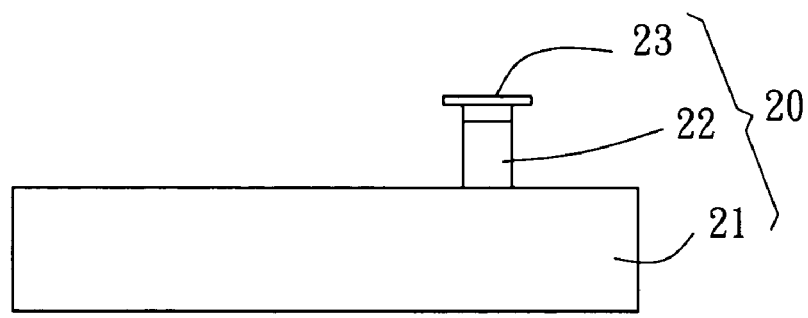
FIG. 6 is a schematic drawing showing the bonding between the probes and the probe holders according to the present invention (I).

The probes 10 and the circuit space converter 20 are bonded together subject to the following Steps I~III:

Step I: Formation of probe holders 22 on the top of the MLC 21. As shown in FIG. 6, probe holders 22 are formed of high hardness, for example, Ni—Co on the topside of the MLC 21 at the respective circuit contacts 65 by means of LIGA (Lithography process), and then a bonding layer 23 in formed of tin lead alloy on the probe holders 22 by means of electroplating for the bonding of the probes 10.

Figure 7:
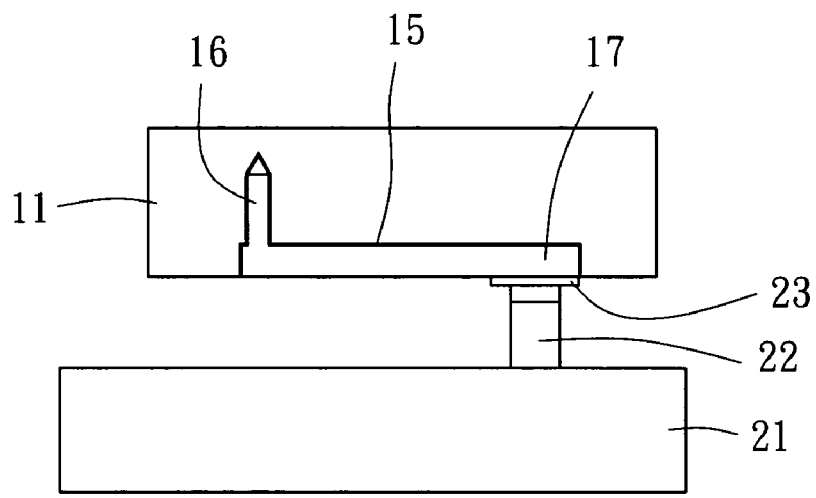
FIG. 7 is a schematic drawing showing the bonding between the probes and the probe holders according to the present invention (II).

Step II: Bonding of probes 10 and circuit space converter 20. As shown in FIG. 7, the top side of the free end of each of the prepared probes 10 is respectively bonded to the bonding layer 23 at each probe holder 22 by means of a bonding procedure.

Figure 8:
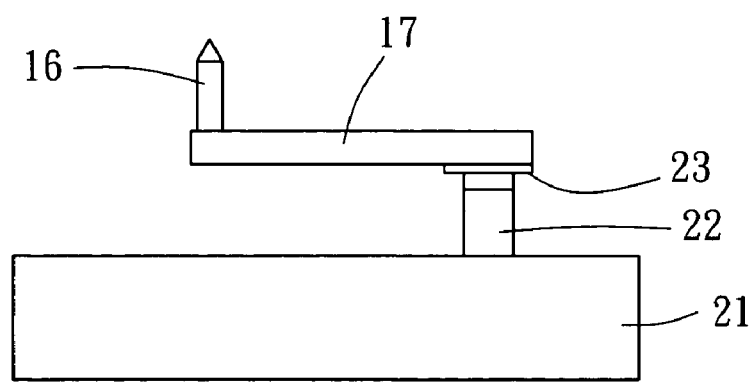
FIG. 8 is a schematic drawing showing the bonding between the probes and the probe holders according to the present invention (III).

Step III: Probe exposing. As shown in FIG. 8, conventional plasma etching technique is employed to etch the substrate (silicon wafer) 11 under the presence of a low-pressure status gas and an applied voltage (so as to remove the substrate 11 and the seed layer 15), leaving the metal cantilever type probes 10 exposed to the outside.

Figure 9:
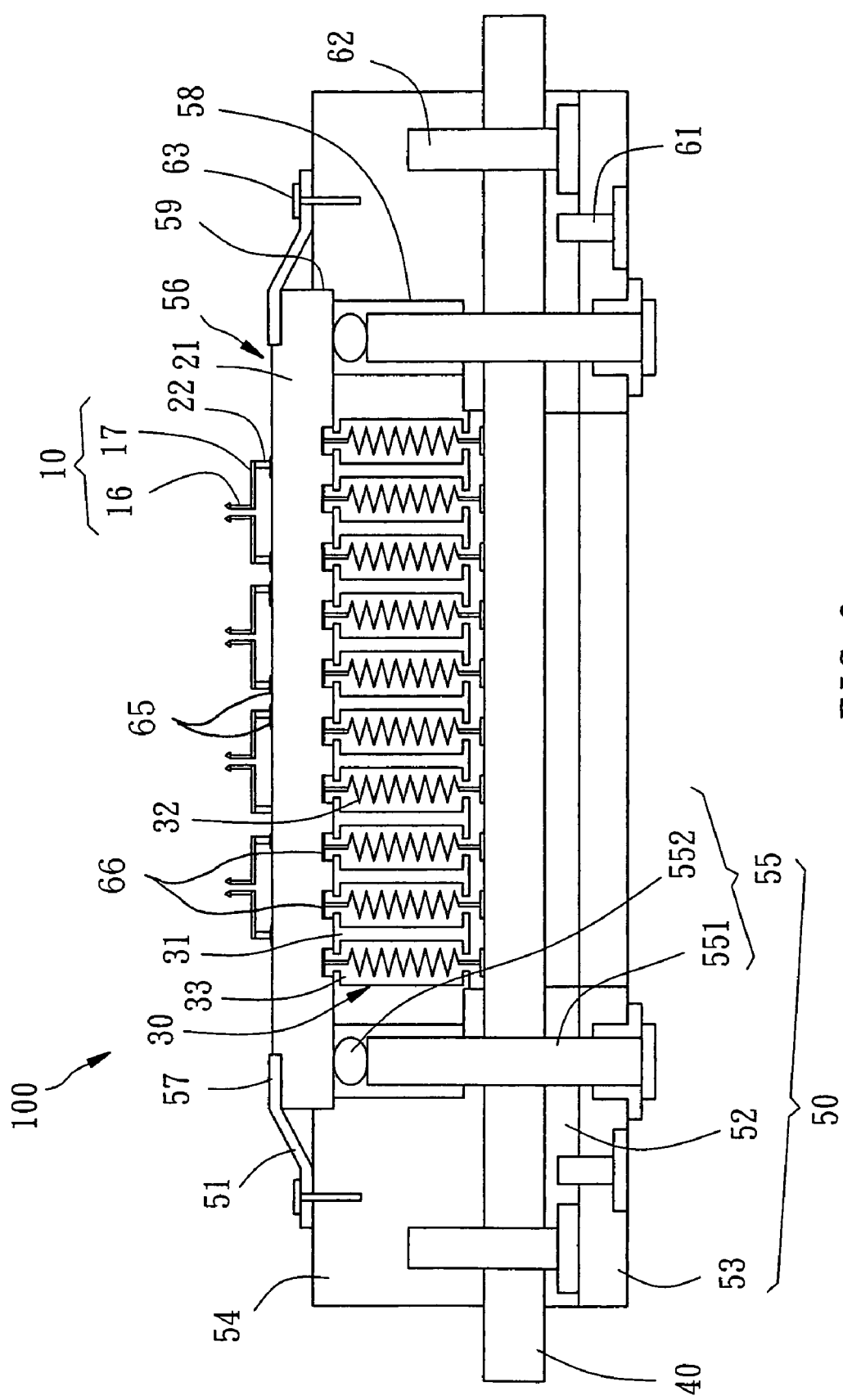
FIG. 9 is a schematic assembly view of an integrated type probe card according to the present invention.

The spring connector plate 30 is comprised of a holder plate 31 and a plurality of spring members 32. The holder plate 31 is made from electrically insulative material, forming an insulative substrate. The holder plate 31 has a predetermined number of receiving holes 33 extended through the top and bottom sides. The spring members 32 are electrically conductive members, for example, pogo pins as shown in FIG. 9, or spring pins 32' (see FIG. 10) made by means of LIGA. The spring members 32 are respectively mounted in the receiving holes 33 with the respective two distal ends respectively protruded over the top and bottom sides of the holder plate 31.

The circuit board 40 is a printed circuit board made subject to probe signal, having circuits and contacts arranged on one side thereof and a plurality of through holes extended through the top and bottom sides at predetermined locations.

Figure 10:
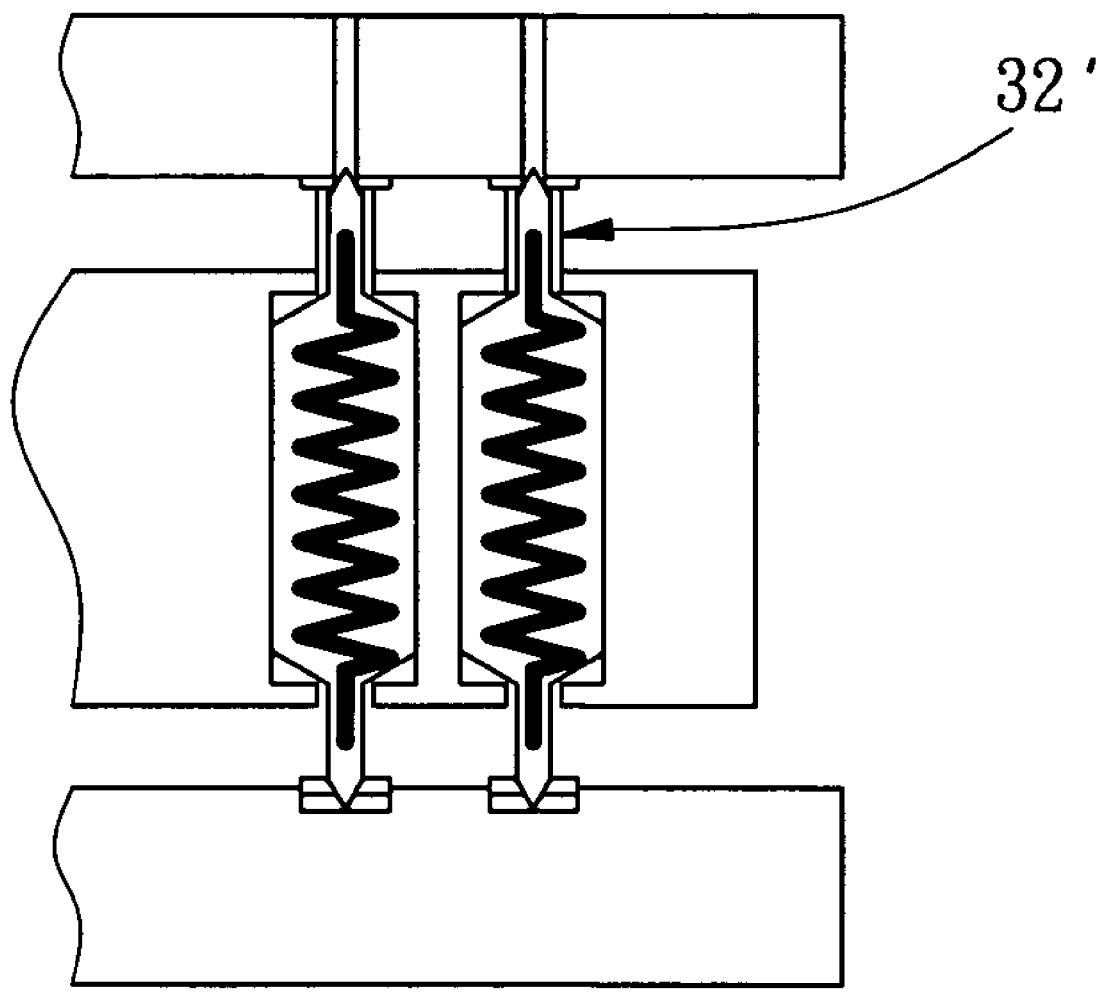
FIG. 10 is a partial view showing an alternate form of the spring members used in the spring connector plate according to the present invention.
Figure 11:
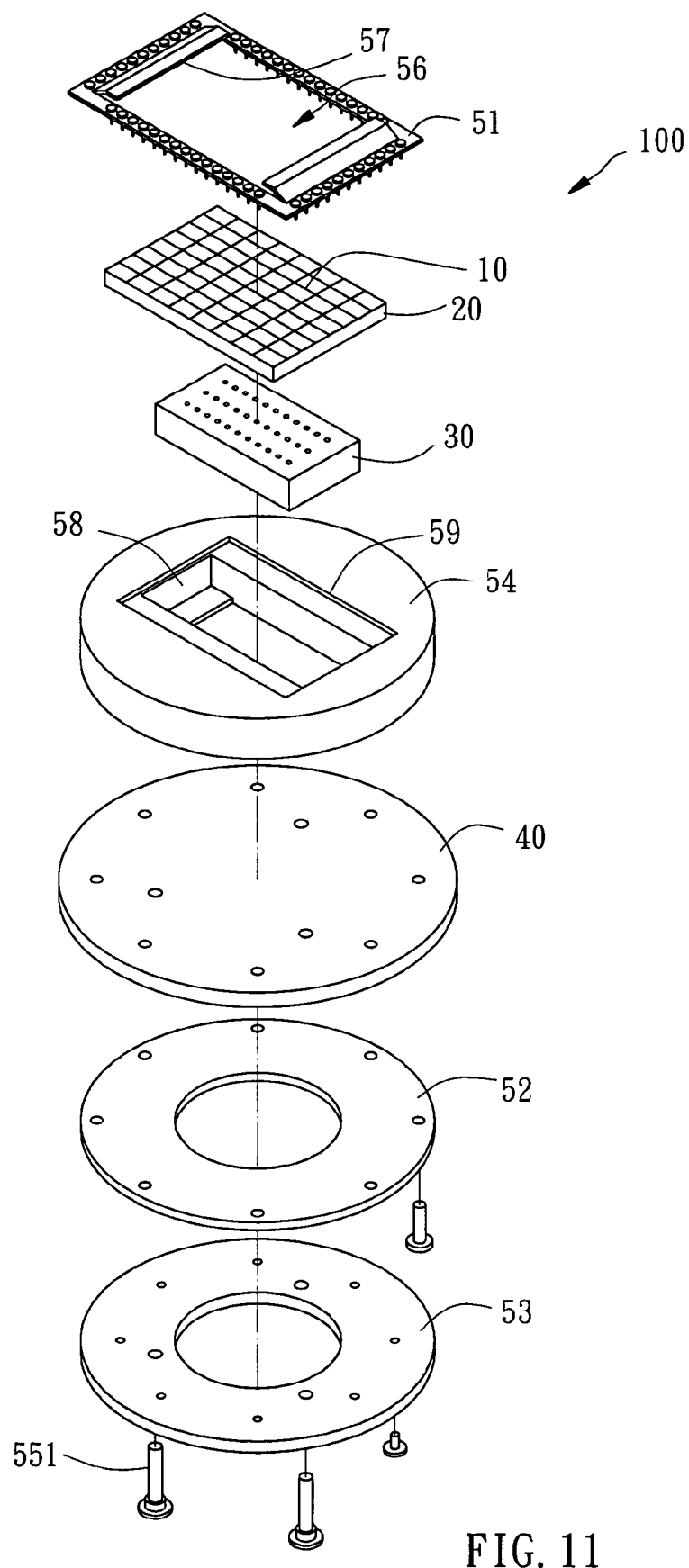
FIG. 11 is an exploded view of the integrated type probe card according to the present invention.

The level adjustment mechanism 50, as shown in FIGS. 9 and 10, is adapted to adjust the level of the probes 10, comprising a holding down plate 51, a back plate 52, an adjustment plate 53, a front locating plate 54, and a plurality of differential adjustment devices 55.

The holding down plate 51 is a spring plate having a center test space 56 cut through the top and bottom side, and four protruding press portions 57 spaced around the center test space 56. The front locating plate 54 has a center receiving open chamber 58 corresponding to the center test space 56 of the holding down plate 51 in size and contour, and a recessed positioning portion 59 of a predetermined depth formed in one side around the center receiving open chamber 58 corresponding to the contour of the circuit space converter 20. The back plate 52 and the adjustment plate 53 have the respective center area opened. The differential adjustment devices 55 are comprised of three sets of differential screws 551 and round balls 552.

Further, a multiplayer PC board may be used to substitute for the aforesaid multiplayer ceramic substrate for electric connection between the probes and the circuit board. The multiplayer PC board has arranged therein multiple layers of circuits and contacts arranged on the top and bottom sides at different density and respectively electrically connected to the multiple layers of circuits.

After understanding of the component parts of the integrated type probe card 100, the assembly process and features of the integrated type probe card 100 are described hereinafter.

At first, fastening devices 61 are used to precisely fasten the back plate 52 and the adjustment plate 53 in a stack, and then fastening devices 62 are used to fasten the circuit board 40 and the front locating plate 54 to the back plate 52, keeping the circuit board 40 sandwiched in between the front locating plate 54 and the back plate 52, and then the spring connector plate 30 is put in the center receiving open chamber 58 of the front locating plate 54, keeping one end of each of the spring members 32 respectively pressed on the respective contacts at the printed circuits of the circuit board 40, and then the circuit space converter 20 is put in the recessed positioning portion 59 of the front locating plate 54 with the side which is connected to the probes 10 exposed to the outside and the other side pressed on the other end of each of the spring members 32 to force the spring members 32 against the circuit board 40, and then fastening devices 63 are used to fasten the holding down plate 51 to the front locating plate 54, keeping the protruding press portions 57 pressed on the periphery of the circuit space converter 20 to hold the circuit space converter 20 in the recessed positioning portion 59 of the front locating plate 54 and to let the probes 10 protrude over the test space 56 of the holding down plate 51, and then the round balls 552 of the differential adjustment devices 55 are put in the front locating plate 54, and then the differential screws 551 are fastened to the adjustment plate 53 and inserted through the back plate 52 and the circuit board 40 into the front locating plate 54 to press the round balls 552 against the circuit space converter 20.

During test, the probes 10 transmit test sample signal to the circuits of the multiplayer ceramic substrate (MLC) 21 of the circuit space converter 20, which transmits signal from the signal contacts of high density at one side thereof to the signal contacts of low density at the other side thereof, for enabling signal to be further transmitted through the spring members 32 of the spring connector plate 30 to the circuit board 40, achieving the test.

If the probes 10 are not level, turn the differential screws 551 forwards or backwards to force the round balls 552 to adjust the level status of the circuit space converter 20 (because three points form a plane, the three differential adjustment devices 55 are sufficient to adjust the level status of the circuit space converter 20), keeping the probes 10 in horizontal. Further, because the spring members 32 of the spring connector plate 30 are used for electric connection between the circuit space converter 20 and the circuit board 40, the spring power of the spring members 32 compensates elevational change during level adjustment of the probes 10 by the differential adjustment devices 5, keeping the circuit space converter 20 and the circuit board 40 electrically connected.

Further, because the invention uses openings in electrically insulative plate members to receive the spring members, preventing production of noises and improving test precision of the probe card.

A prototype of integrated type probe card has been constructed with the features of FIGS. 1~11. The integrated type probe card functions smoothly to provide all of the features discussed earlier.

Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. An integrated type probe card comprising:
   a plurality of probes;
   a circuit space converter, said circuit space converter comprising multiple layers of circuits therein, and a plurality of first contacts and second contacts respectively arranged at two opposite sides of said multiple layers of circuits and electrically connected to the circuits, the density of said first contacts being higher than said second contacts, said first contacts being respectively connected to said probes for transmitting signal from said probes to said second contacts;
   a spring connector plate, said spring connector plate comprising a holder plate, said holder plate having a predetermined number of receiving holes extended through top and bottom sides thereof, and a plurality of metal spring members respectively mounted in the receiving holes of said holder plate, said metal spring members each having two distal ends respectively protruded over the top and bottom sides of said holder plate and having one of the respective two distal ends respectively electrically connected to said second contacts of said circuit space converter;
   a circuit board pressed on one of the two distal ends of each of said metal spring members against the second contacts of said circuit space converter, said circuit board having a plurality of circuits and contacts arranged on one side thereof and electrically connected to said metal spring members of said spring connector plate for testing electric signal transmitted from said probes; and
   a level adjustment mechanism adapted to hold said probes, said circuit space converter, said spring connector plate and said circuit board in order and to adjust the level status of said circuit space converter, for enabling said metal spring members to compensate elevational difference between said circuit space converter and said spring connector plate and to keep said circuit space converter electrically connected to said circuit board.

2. The integrated type probe card as claimed in claim 1, wherein said probes are cantilever type probes.

3. The integrated type probe card as claimed in claim 1, wherein said probes each have a free end shaped like a quadrilateral prism.

4. The integrated type probe card as claimed in claim 1, wherein said probes are made from nickel cobalt alloy.

5. The integrated type probe card as claimed in claim 1, wherein said circuit space converter comprises a multiplayer ceramic substrate, which has the multiple layers of circuits of said circuit space converter arranged therein and the first contacts and second contacts of said circuit space converter respectively arranged at two opposite sides thereof.

6. The integrated type probe card as claimed in claim 5, wherein said circuit space converter further comprises a plurality of probe holders formed on the top side of said multiplayer ceramic substrate for the bonding of said probes.

7. The integrated type probe card as claimed in claim 6, wherein said probe holders are formed on the top side of said multiplayer ceramic substrate by electro-forming by means of LIGA (Lithography process).

8. The integrated type probe card as claimed in claim 6, wherein said probe holders are made from nickel cobalt alloy.

9. The integrated type probe card as claimed in claim 1, wherein said holder plate of said spring connector plate is made from an electrically insulative material.

10. The integrated type probe card as claimed in claim 1, wherein said metal spring members are pogo pins.

11. The integrated type probe card as claimed in claim 1, wherein said metal spring members are compression springs.

12. The integrated type probe card as claimed in claim 1, wherein said level adjustment mechanism is comprised of a holding down plate, a back plate, an adjustment plate, a front locating plate, and a plurality of differential adjustment devices, said back plate and said adjustment plate being arranged in a stack and fastened together with fastening members, said front locating plate being fastened to said back plate to hold said circuit board in between said front locating plate and said back plate, said front locating plate having a center receiving open chamber adapted to accommodate said spring connector plate and a recessed positioning portion formed in one side there around said center receiving open chamber and adapted to accommodate said circuit space converter, said holding down plate being fastened to said front locating plate and having a test space and a plurality of protruding press portions suspended around said test space and pressed on the periphery of said circuit space converter to hold said circuit space converter in the recessed positioning portion of said front locating plate and to let said probes protrude over the test space of said holding down plate.

13. The integrated type probe card as claimed in claim 12, wherein said differential adjustment devices are arranged in three sets each comprising a round ball put in said front locating plate and a differential screw fastened to said adjustment plate and pressed on said round ball against said circuit space converter.

14. The integrated type probe card as claimed in claim 12, wherein said holding down plate is a spring plate.

15. The integrated type probe card as claimed in claim 1, wherein said circuit space converter comprises a multiplayer circuit board, which has the multiple layers of circuits of said circuit space converter arranged therein and the first contacts and second contacts of said circuit space converter respectively arranged at two opposite sides thereof.

16. An integrated type probe card fabrication method comprising the steps of:
   (a) preparing a circuit space converter, which comprises multiple layers of circuits arranged therein and a plurality of first contacts and second contacts respectively arranged on two opposite sides thereof at different densities and respectively connected to said multiple layers of circuits, and then connecting a plurality of probes to said first contacts of said circuit space converter respectively;
   (b) preparing a spring connector plate comprised of a holder plate and a plurality of metal spring members, said holder plate having a plurality of receiving holes extended through top and bottom sides thereof, said metal spring members being respectively mounted in the receiving holes of said holder plate and having each two distal ends respectively protruded over the top and bottom sides of said holder plate;
   (c) preparing a circuit board having circuits on one side thereof for receiving signal from said probes and contacts at the circuits, and then pressing said circuit board on said metal spring members against said second contacts of said circuit space converter to keep the contacts of said circuit board in contact with said metal spring members for receiving signal from said probes; and preparing a level adjustment mechanism to accommodate said spring connector plate and said circuit board and to adjust the level status of said circuit space converter, said level adjustment mechanism being comprised of a holding down plate, a back plate, an adjustment plate, a front locating plate, and a plurality of differential adjustment devices, said back plate and said adjustment plate being arranged in a stack and fastened together with fastening members, said front locating plate being fastened to said back plate to hold said circuit board in between said front locating plate and said back plate, said front locating plate having a center receiving open chamber adapted to accommodate said spring connector plate and a recessed positioning portion formed in one side there around said center receiving open chamber and adapted to accommodate said circuit space converter, said holding down plate being fastened to said front locating plate and having a test space and a plurality of protruding press portions suspended around said test space and pressed on the periphery of said circuit space converter to hold said circuit space converter in the recessed positioning portion of said front locating plate and to let said probes protrude over the test space of said holding down plate, said differential adjustment devices being arranged in three sets each comprising a round ball put in said front locating plate and a differential screw fastened to said adjustment plate and pressed on said round ball against said circuit space converter.

17. The integrated type probe card fabrication method as claimed in claim 16, wherein the density of said first contacts is higher than the density of said second contacts.

* * * * *